United States Patent [19]

Theus

[11] Patent Number: 5,047,729
[45] Date of Patent: Sep. 10, 1991

[54] TRANSCONDUCTANCE AMPLIFIER

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 615,550

[22] Filed: Nov. 19, 1990

[30] Foreign Application Priority Data

Dec. 1, 1989 [EP] European Pat. Off. ........ 89122203.6

[51] Int. Cl.$^5$ ............................................. H03F 3/45
[52] U.S. Cl. ..................................... 330/252; 330/261
[58] Field of Search ............... 330/252, 257, 261, 288, 330/296

[56] References Cited

U.S. PATENT DOCUMENTS 4,901,031 2/1990 Kalthoff et al. ..................... 330/253
4,951,003 8/1990 De Jager et al. ..................... 330/252

FOREIGN PATENT DOCUMENTS 0234655 9/1987 European Pat. Off. .
3243145 6/1983 Fed. Rep. of Germany .
56-93405 7/1981 Japan .
63-38313 2/1988 Japan .

OTHER PUBLICATIONS

"Tridifferenzverstarker," *Radio Fernsehen Electronik*, vol. 34, No. 5, May 1985, p. 333.
Mamoru Ohara, et al., "Bipolar Monolithic Amplifiers for a Gigabit Optical Repeater", IEEE Journal of Solid-State Circuits, vol. SC-19, No. 4, Aug. 1984, pp. 491-497.

*Primary Examiner*—Steven Mottola
*Attorney, Agent, or Firm*—Thomas L. Peterson

[57] ABSTRACT

A transconductance amplifier is driven by a difference voltage which is coupled through a first input terminal to a first voltage-to-current converter and through a second input terminal to a second voltage-to-current converter of identical design. An identical third voltage-to-current converter has its input terminal connected to the tap of a resistive voltage divider which is connected between the first and second input terminals. The output signal of the transconductance amplifier can be taken from the current outputs of the first and second voltage-to-current converters. The current outputs have a difference current which is proportional to the value of the difference voltage.

10 Claims, 2 Drawing Sheets

TRANSCONDUCTANCE AMPLIFIER

BACKGROUND OF THE INVENTION

1. Field of the Invention

The present invention is in the field of transconductance amplifiers for amplifying or attenuating analog signals.

2. Description of the Related Art

A transconductance amplifier converts a voltage signal to a current signal as linearly as possible, with the output forming as ideal a current source as possible. Such transconductance amplifiers are used to advantage instead of voltage amplifiers where analog signals are to be amplified or attenuated, e.g., for continuous or step-by-step gain control. Another application is the implementation of switchover and switch-off functions, which is easier with currents than with voltages. In that case, transconductance amplifiers are preceded by analog multipliers which have a current-dividing network and are controlled by a control signal, which becomes a switching signal in an extreme case.

A further application of transconductance amplifiers is in the implementation of integrators. As a rule, currents are integrated there by means of a capacitor, i.e., the voltage signals to be integrated first have to be converted into current signals.

The dynamic range of conventional transconductance amplifiers is determined by the value of the quiescent current, which is usually at the center of the dynamic range. Under overload conditions, the output current is limited at the overload level by twice the value of the quiescent current and at the minimum acceptable signal level by the current which has become zero. This limiting results in nonlinear distortion, which is caused by odd harmonics.

SUMMARY OF THE INVENTION

The object of the invention as claimed is to provide a transconductance amplifier for difference signals whose dynamic range is not limited by the established operating point, and whose level of harmonic distortion is low despite a small amount of internal negative feedback.

BRIEF DESCRIPTION OF THE DRAWINGS

The invention and its advantages will now be explained in greater detail with reference to the accompanying drawings, in which.

DETAILED DESCRIPTION OF THE PREFERRED EMBODIMENTS

Figure 1:
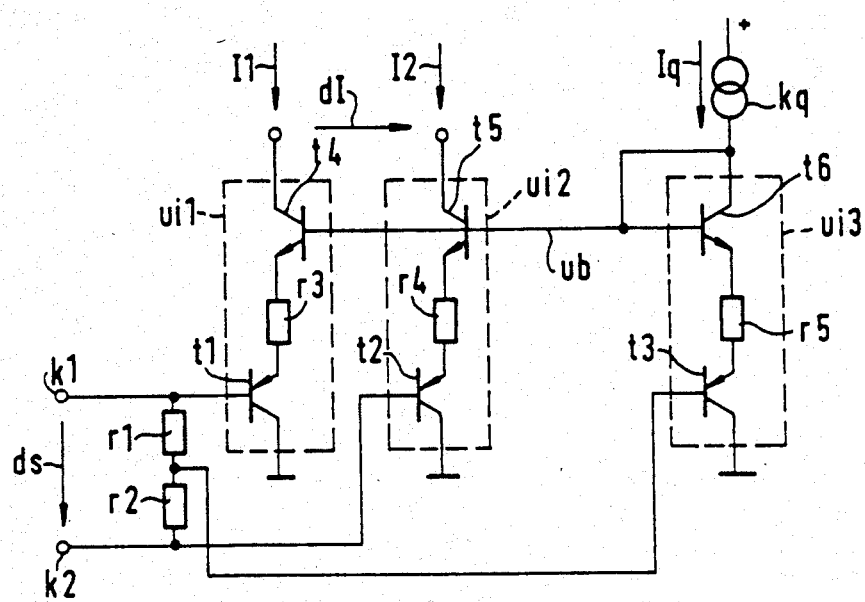
FIG. 1 is a schematic circuit diagram of a simple embodiment of the invention.

FIG. 1 shows a simple embodiment of a transconductance amplifier in accordance with the invention. The circuit comprises three identical voltage-to-current converters ui1, ui2, ui3, the first of which, ui1, has its input connected to the first input terminal k1, and the second of which, ui2, has its input connected to a second input terminal k2. The two input terminals k1, k2 serve as the input for a difference voltage ds to be applied to the transconductance amplifier.

The three voltage-to-current converts ui1, ui2, ui3 are integrated as bipolar circuits on a single chip, with the good matching characteristics of the individual circuit elements having a favorable effect. An advantage for the high-frequency response is that the dynamic subcircuits contain only npn transistors and substrate-pnp transistors, but no lateral pnp transistors, which have a low cutoff frequency.

All three voltage-to-current Converters ui1, ui2, ui3 have in their input portions a substrate-pnp transistor, as, for example, first, second, and third transistors t1, t2, t3, respectively, in FIG. 1. Their collectors are formed by the substrate, and their emitters are respectively connected via third, fourth, and fifth resistors r3, r4, r5 to the emitters of fourth, fifth, and sixth transistors t4, t5, t6, which are npn transistors. The base terminals of these three npn transistors are at a common reference potential ub, which is determined by the third voltage-to-current converter ui3 and a constant-current source kq.

The collectors of the fourth and fifth transistors t4, t5 form the high-impedance difference output of the transconductance amplifier. Since the bases of the first and second transistors t1, t2 are connected to the first and second input terminals k1, k2, respectively, the collector currents of the fourth and fifth transistors t4, t5 depend on the potentials of the first and second input terminals k1, k2, respectively. The output current of each of the two voltage-to-current converters follows the potential of the associated input terminal. The current rise is limited by the third and fourth resistors r3, r4 in the first and second voltage-to-current converters ui1, ui2, respectively. The value of the output current is also determined by the differential transconductance $I/U_T$ of the two series-connected base-emitter paths in each voltage-to-current converter. The first output current I1 of the transconductance amplifier is the collector current of the fourth transistor t4, and the second output current I2 is the collector current of the fifth transistor t5.

The reference potential ub is set by the third voltage-to-current converter ui3, whose current output is coupled to the common base terminal of the three npn transistors. The interconnected base-collector terminal of the sixth transistor t6 is fed with a current Iq from the constant-current source kq. This current also determines the quiescent current Iq of the first and second voltage-to-current converters ui1, ui2.

A voltage divider is connected between the first and second input terminals k1, k2. The voltage divider comprises a first resistor r1 and a second resistor r2. The tap of this voltage divider is connected to the input of the third voltage-to-current converter ui3, i.e., to the base of the third transistor t3.

If the two input terminals k1, k2 are at the same potential, the tap of the voltage divider r1, r2 will also be at this potential. In that case, all three voltage-to-current converters ui1, ui2, ui3 are traversed by the same current Iq, namely the quiescent current. If a difference voltage ds is applied between the two input terminals k1, k2, the two output currents I1, I2 will change. One of the two output currents will increase and the other will decrease.

If the two output currents I1, I2 were strictly linearly dependent on the input potential, one of them would increase by a difference current dI and the other would decrease by the same difference current dI. This, however, would result in the undesired hard limiting, as described above.

However, the circuit concept underlying the invention permits limiting-free operation even in that range in which one of the two voltage-to-current converters ui1, ui2 has become nearly currentless. In this range, changes in the difference voltage ds mainly affect only one of the output currents I1, I2, namely with a steeper slope than in the not fully driven case with I1=I2. As a result, the slope of the difference current dI remains nearly current.

The operation of the circuit according to the invention is based on the fact that the transconductance of the three voltage-to-current converters ui1, ui2, ui3 is set via the feedback resistors r3, r4, r5 and the quiescent current Iq so that the negative-feedback action of the three resistors r3, r4, r5 is approximately equal to the differential transconductance $I/U_T$ of the base-emitter path. As the difference voltage ds increases, the output current I1, I2 of one of the voltage-to-current converters ui1, ui2 and the associated transconductance increases, while the other output current I2, I1 and the associated transconductance decreases, The two effects cancel each other, so that the difference dI between the first and second output currents I1, I2 remains proportional to the value of the difference voltage ds.

The current Iq of the constant-current source and, thus, the quiescent current Iq of the three voltage-to-current converters ui1, ui2, ui3 and the values of the three feedback resistors r3, r4, r5 must be chosen according to the following rule:

$$U < Iq \times r < 2U_T.$$

where r=r3=r4=r5, and where $U_T$ is the thermal voltage, which, in theory, is 26 mV. This keeps the negative-feedback action of the three resistors r3, r4, r5 at a low level. The low-value feedback resistors r3, r4, r5 also have a favorable effect on the noise performance of the transconductance amplifier.

Figure 2:
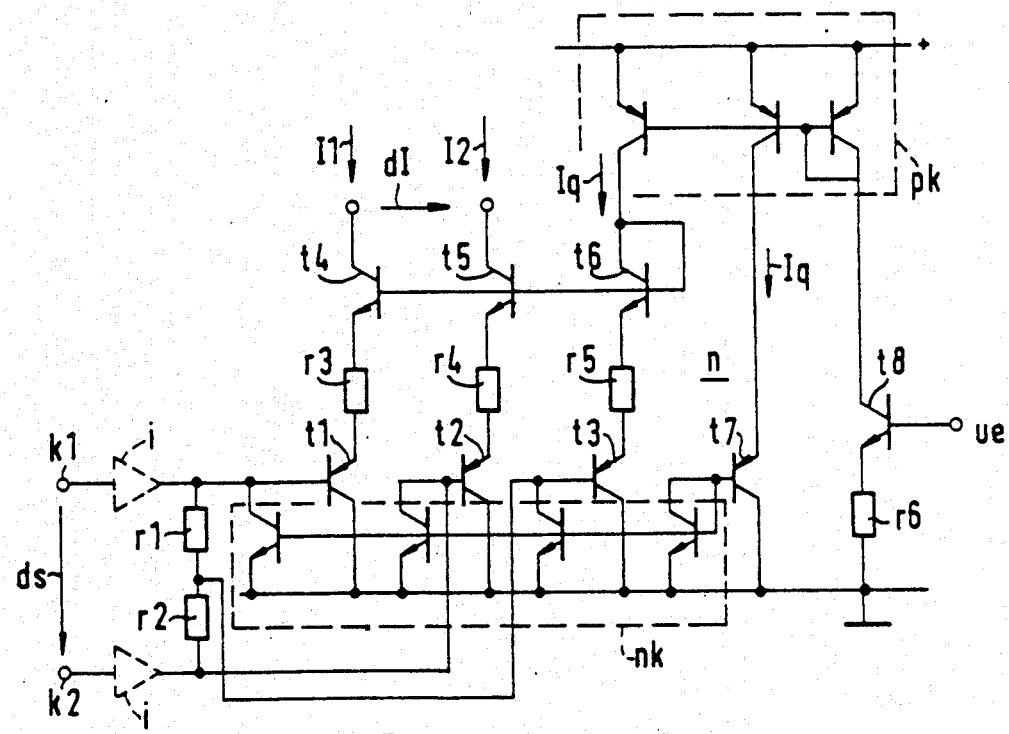
FIG. 2 shows an improved embodiment of the present invention.

FIG. 2 shows an improved embodiment of the transconductance amplifier of FIG. 1. To illustrate that the circuit of FIG. 2 largely corresponds to that of FIG. 1, like parts are designated by like reference characters. The principle of operation is also the same and, therefore, need not be explained again.

The circuit arrangement of FIG. 1 has the disadvantage that the base currents of the first, second and third transistors t1, t2, t3, load the two input terminals k1, k2 and the tap of the voltage divider r1, r2. The difference voltage ds may be falsified via the source impedance and the resistance of the voltage divider r1, r2, but above all, the load on the voltage-divider tap disturbs the ratio of the three output currents I1, I2, Iq. This, of course, affects the magnitude and accuracy of the (fictitious) difference current dI. The difference current dI can be obtained, for example, by supplying the first and second output currents I1, I2 to the input and output, respectively, of a pnp current mirror (not shown in FIGS. 1 and 2).

These disadvantages are eliminated in the improved embodiment of the invention (shown, for example, in FIG. 2) by compensating the base currents of the three pnp transistors t1, t2, t3 by the output currents of an npn current bank nk, whose current is set by a simulating circuit n. The simulating circuit n is driven with a current Iq which is equal in value to the current Iq of the constant-current source kq.

The simulating circuit n contains a seventh transistor t7 which is an exact replica of the three pnp transistors t1, t2, t3 and, like the latter, is a substrate pnp transistor. The base current of the seventh transistor t7 is supplied to the input of a three-stage npn current bank whose three outputs are connected to the base terminals of the three pnp transistors t1, t2, t3.

The third voltage-to-current converter ui3 and the simulating circuit n are each fed with the constant current Iq. These currents Iq are delivered, for example, by a two-stage pnp current bank pk, whose input is connected to the collector of an eighth transistor t8, an npn transistor, whose emitter is grounded through a sixth resistor r6. The current of the pnp current bank pk, and, thus, the quiescent current of the transconductance amplifier are set via a voltage ue applied to the base of the eighth transistor t8.

As further illustrated in FIG. 2, the transconductance amplifier may advantageously include a pair of impedance transformers i (shown in dashed lines) to buffer the first and second input terminals k1, k2 from the base terminals of the transistors t1 and t2 and from the resistive divider r1, r2.

Figure 3:
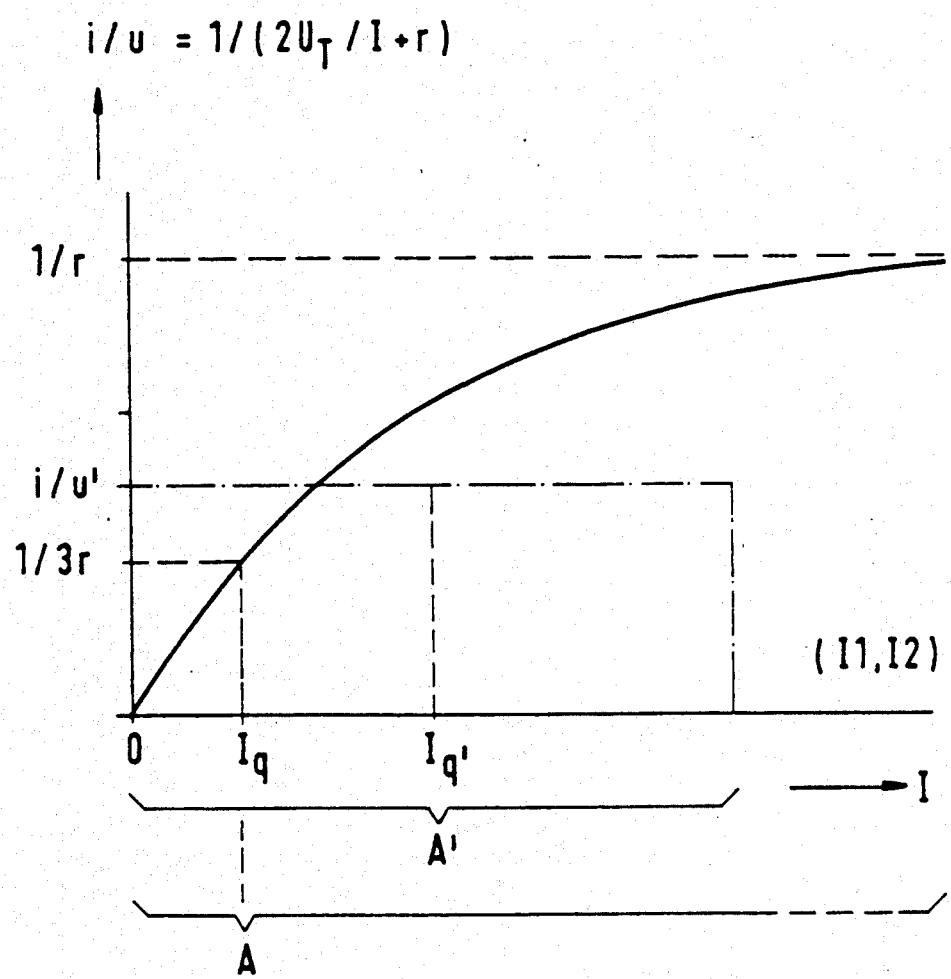
FIG. 3 shows the variation of the transconductance of a voltage-to-current converter as a function of quiescent current.

In FIG. 3, the transconductance i/u of the three voltage-to-current converters ui1, ui2, ui3 is plotted as a function of the output current I. According to the above design rule, the following relation holds for the transconductance i/u if $r = U_T/Iq$:

$$i/u = 1/(2U_T/I + r)$$

For large currents I, the transconductance i/u is equal to 1/r, i.e., a constant value which is dependent only on the value of the respective feedback resistor r. For small currents I, the transconductance i/u is equal to $I/2U_T$, i.e., it is dependent only on the differential transconductance $I/U_T$ of the two base-emitter paths, not on the value of the feedback resistor r. For the quiescent current Iq, the transconductance $i/u = \frac{1}{3}r$. The dynamic range A may extend arbitrarily far in to the range of large currents, because the transconductance i/u remains constant there. Thus, the difference current dI also remains proportional to the difference voltage ds. The relatively low quiescent current Iq also causes low power consumption. The dash-and-dot line represents the usual constant transconductance characteristic i/u' with a symmetrical dynamic range A' and a higher quiescent current Iq'.

What is claimed is:

1. A transconductance amplifier that provides a difference output current in response to a difference input voltage applied between first and second voltage input terminals, comprising:

a first voltage-to-current converter having an input terminal coupled to said first voltage input terminal, said first voltage-to-current converter having a reference-potential terminal and having a current output terminal that provides a first output current having a first output current magnitude, said first voltage-to-current converter having a first transconductance characteristic and having a first resistor that sets said first transconductance characteristic;

a second voltage-to-current converter having an input terminal coupled to said first voltage input terminal, said second voltage-to-current converter having a reference-potential terminal and a current output terminal that provides a second output current having a second output current magnitude, said second voltage-to-current converter having a second transconductance characteristic and having a second resistor that sets said second transconductance characteristic, said difference output current having a magnitude equal to the difference between said first and second output current magnitudes, said magnitude of said difference output current proportional to said difference input voltage;

a resistive voltage divider coupled between said first and second voltage input terminals, said resistive voltage divider having an output tap;

a constant current source that provides a quiescent constant current; and a third voltage-to-current converter having an input terminal coupled to said output tap of said resistive voltage divider, having a reference-potential terminal, and having a current terminal connected to said constant current source, said third voltage-to-current converter having a third transconductance characteristic and having a third resistor that sets said third transconductance characteristic, said reference-potential terminal of said third voltage-to-current converter connected to said reference-potential terminals of said first and second voltage-to-current converters so that said first, second and third reference-potential terminals are at a common reference potential determined by said third voltage-to-current converter.

2. The transconductance amplifier as defined in claim 1, wherein said first, second and third voltage-to-current converters are identical.

3. The transconductance amplifier as defined in claim 1, wherein:
said first voltage-to-current converter comprises a first transistor having a first base, said first base being said input terminal of said first voltage-to-current converter;
said second voltage-to-current converter comprises a second transistor having a second base, said second base being said input terminal of said second voltage-to-current converter; and
said third voltage-to-current converter comprises a third transistor having a third base, said third base being said input terminal of said third voltage-to-current converter.

4. The transconductance amplifier as defined in claim 3, wherein said first, second and third bases have first, second and third base currents, respectively, and said transconductance amplifier further comprises a simulating circuit having first, second and third outputs connected to said first, second and third bases, respectively, said first output providing a first current equal in magnitude but opposite in polarity to said first base current, said second output providing a second current equal in magnitude but opposite in polarity to said second base current, and said third output providing a third current equal in magnitude but opposite in polarity to said third base current.

5. The transconductance amplifier as defined in claim 4, wherein:
said first, second and third transistors have respective first, second and third emitters, the base-emitter junctions of said first, second and third transistors being of a first type;

said first voltage-to-current converter further comprises a fourth transistor having a base and an emitter, the base-emitter junction of said fourth transistor being of a second type opposite said first type, said emitter of said fourth transistor being connected via said first resistor to said emitter of said first transistor, said base of said fourth transistor being connected to said first reference-potential terminal;

said second voltage-to-current converter further comprises a fifth transistor having a base and an emitter, the base-emitter junction of said fifth transistor being of said second type, said emitter of said fifth transistor being connected via said second resistor to said emitter of said second transistor, said base of said fifth transistor being connected to said second reference-potential terminal; and said third voltage-to-current converter further comprises a sixth transistor having a base and an emitter, the base-emitter junction of said sixth transistor being of said second type, said emitter of said sixth transistor being connected via said third resistor to said emitter of said third transistor, said base of said sixth transistor being connected to said third reference-potential terminal.

6. The transconductance amplifier as defined in claim 5, wherein said first type is pnp and said second type is npn.

7. The transconductance amplifier as defined in claim 5, further comprising:
a pnp current bank having first and second outputs, said first output being said constant-current source, said second output being provided as an input to said simulating circuit,
said simulating circuit comprising:
a seventh transistor of said first type having a base and an emitter, said base having a base current; and
an npn current bank having an input and first, second and third outputs, said input connected to receive base current from said seventh transistor, said first output connected to said base of said first transistor, said second output connected to said base of said second transistor, and said third output connected to said base of said third transistor.

8. The transconductance amplifier as defined in claim 7, wherein said first type is pnp and said first, second, third and seventh transistors are substrate-pnp transistors.

9. The transconductance amplifier as defined in claim 1, wherein each of said first, second and third resistors has a resistance r, each of said first, second and third voltage-to-current converters has a transconductance $U_T$, and said resistance r is selected so that $$U_T < I_q \times r < 2U_T$$

where $I_q$ is the quiescent current supplied by said constant current source.

10. The transconductance amplifier as defined in claim 1, wherein said first and second voltage input terminals are buffered from said first and second input terminals of said first and second voltage-to-current converters by respective first and second impedance transformers.

* * * * *